US009746976B2

(12) United States Patent
Leong et al.

(10) Patent No.: US 9,746,976 B2
(45) Date of Patent: Aug. 29, 2017

(54) TOUCH CONTROL DEVICE AND FABRICATION METHOD THEREOF

(71) Applicant: TPK Universal Solutions Limited, Hong Kong (CN)

(72) Inventors: Wee-Hong Leong, Kuala Lumpur (MY); Shiang-Ting Wu, Taoyuan (TW); Po-Yi Wu, Taoyuan (TW); Cheng-Yuan Lu, Taoyuan (TW)

( * ) Notice: Subject to any disclaimer, the term of this patent is extended or adjusted under 35 U.S.C. 154(b) by 0 days.

(21) Appl. No.: 14/672,216

(22) Filed: Mar. 29, 2015

(65) Prior Publication Data

US 2015/0277628 A1    Oct. 1, 2015

(30) Foreign Application Priority Data

Mar. 31, 2014    (CN) .......................... 2014 1 0127386

(51) Int. Cl.
    *G06F 3/041*    (2006.01)
    *G06F 3/044*    (2006.01)
    *H03K 17/96*    (2006.01)

(52) U.S. Cl.
    CPC ............ *G06F 3/044* (2013.01); *G06F 3/041* (2013.01); *G06F 3/0416* (2013.01); *G06F 3/0418* (2013.01); *H03K 17/96* (2013.01); *G06F 2203/04103* (2013.01); *H03K 2217/96015* (2013.01)

(58) Field of Classification Search
    CPC .................................................... G06F 3/044
    See application file for complete search history.

(56) References Cited

U.S. PATENT DOCUMENTS

| | | | | |
|---|---|---|---|---|
| 9,170,696 B2* | 10/2015 | Ishizaki | .................. | G06F 3/044 |
| 9,258,877 B2* | 2/2016 | Gao | ........................ | G06F 3/041 |
| 9,383,871 B2* | 7/2016 | Adachi | ................. | G06F 3/0412 |
| 2011/0018838 A1* | 1/2011 | Lee | .......................... | G06F 3/044 345/174 |
| 2012/0098782 A1* | 4/2012 | Nam | ........................ | G06F 3/044 345/174 |
| 2014/0083742 A1* | 3/2014 | Gao | ........................ | G06F 3/041 174/250 |
| 2014/0184560 A1* | 7/2014 | Adachi | ................. | G06F 3/0412 345/174 |
| 2014/0210784 A1* | 7/2014 | Gourevitch | .......... | H03K 17/962 345/174 |
| 2014/0292713 A1* | 10/2014 | Koito | .................... | G06F 3/0412 345/174 |

(Continued)

FOREIGN PATENT DOCUMENTS

CN    101513848    8/2009
KR    20120018059   2/2012

*Primary Examiner* — Patrick F Marinelli (57) ABSTRACT

A touch control device includes at least one sensing unit that includes an electrically insulating and light transmissive substrate, multiple mutually electrically insulating touch control electrode structures spacedly disposed on a same side of the substrate, and at least one dummy electrode set disposed on the substrate and located between adjacent ones of the touch control electrode structures. The dummy electrode set forms a groove that extends from a top side thereof through to the substrate and including a plurality of dummy electrode structures that are dividedly defined by said groove. The groove extends between the adjacent ones of the touch control electrode structures and forms at least one bent.

10 Claims, 10 Drawing Sheets

(56) References Cited

U.S. PATENT DOCUMENTS

| | | | | | |
|---|---|---|---|---|---|
| 2014/0293159 | A1* | 10/2014 | Adachi | ........... | G06F 3/0412 349/12 |
| 2014/0320760 | A1* | 10/2014 | Ishizaki | ........... | G06F 3/044 349/12 |
| 2015/0109248 | A1* | 4/2015 | Tokai | ........... | G06F 3/044 345/174 |
| 2015/0277628 | A1* | 10/2015 | Leong | ........... | G06F 3/0416 345/174 |
| 2015/0309636 | A1* | 10/2015 | Kurasawa | ........... | G06F 3/044 345/173 |
| 2015/0331527 | A1* | 11/2015 | Ishizaki | ........... | G02F 1/13338 345/174 |
| 2015/0346850 | A1* | 12/2015 | Vandermeijden | ........... | G06F 3/041 345/173 |
| 2016/0103523 | A1* | 4/2016 | Chen | ........... | G06F 3/0412 345/174 |
| 2016/0202789 | A1* | 7/2016 | Kim | ........... | G06F 3/0412 345/174 |

\* cited by examiner

TOUCH CONTROL DEVICE AND FABRICATION METHOD THEREOF

BACKGROUND OF THE INVENTION

This application claims priority to Chinese Application Serial Number 201410127386.2, filed on Mar. 31, 2014, which is herein incorporated by reference.

FIELD OF THE INVENTION

This invention relates to a touch control device and a fabrication method thereof, and more particularly to a touch control device that is fabricated using laser etching technology, and a fabrication method that adopts the laser etching technology.

RELATED ART OF INVENTION

The touch control technology has been widely used in various electronic appliances. For example, in Taiwanese Patent No. I430160, there is disclosed a touch panel and a fabrication method thereof. The touch panel includes structures such as a touch control electrode, insulating structures, conductive wires, etc. During the fabrication process, these structures and components are separately manufactured, and each involves the processes of coating, lithography, etching, etc.

However, such fabrication method that involves these coating, lithography, etching processes is too complex and adversely affects enhancement of production rate and reduction of production cost.

SUMMARY OF THE INVENTION

Therefore, an object of this disclosure is to provide a touch control device that is fabricated by a simple fabrication technique and that has good performance.

Accordingly, a touch control device of this disclosure includes at least one sensing unit. The sensing unit includes a substrate, a plurality of touch control electrode structures and at least one dummy electrode set. The touch control electrode structures are mutually spacedly disposed on a same side of the substrate and are mutually electrically insulating. The dummy electrode set is disposed on the substrate and located between adjacent ones of the touch control electrode structures. The dummy electrode set forms a groove that extends from a top side thereof through to the substrate and includes a plurality of dummy electrode structures which are dividedly defined by the groove. The groove extends between the adjacent ones of the touch control electrode structures and forms at least one bend.

Therefore, another object of this disclosure is to provide a fabrication method for the aforesaid touch control device. The fabrication method includes the steps of: (A) forming a structure body on a substrate; and (B) performing laser etching on the structure body such that the structure body is indentedly formed with a groove. The groove extends through a top face of the structure body through to the substrate, extends to form at least bend, and is formed by continuously etching according to a predefined route with laser.

The effect of this disclosure resides in that: the touch control device of this disclosure is fabricated through laser etching, and a plurality of regions are formed on the dummy electrode set by the groove, thereby having good device performance. The fabrication method of this disclosure adopts the laser etching technology, and in comparison with the conventional lithography and etching fabrication procedures for fabricating structures, it can effectively save fabrication steps, fabrication time and cost. Besides, through suitable setting of the laser advancing route and fabrication parameters, the fabrication method of this disclosure can further enhance the production efficiency of fabricating touch control devices or various devices through laser etching.

BRIEF DESCRIPTION OF DRAWINGS

Other features and advantages of the present disclosure will become apparent in the following detailed description of the embodiments with reference to the accompanying drawings, of which.

DETAILED DESCRIPTION OF THE INVENTION

Before the present disclosure is described in greater detail, it should be noted that like elements are denoted by the same reference numerals throughout the disclosure.

Figure 1:
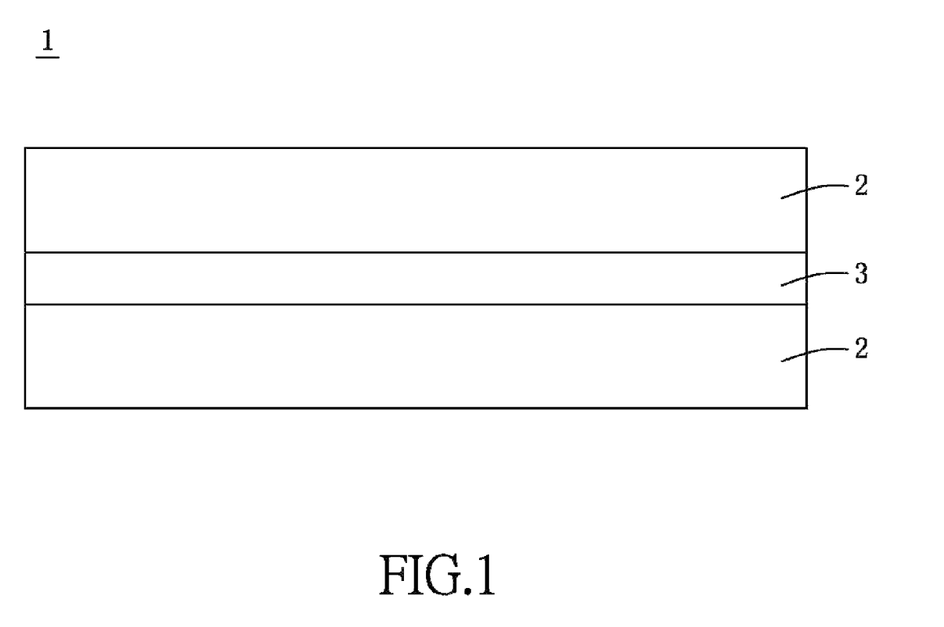
FIG. 1 is a schematic diagram illustrating an embodiment of a touch control device of this disclosure.
Figure 2:
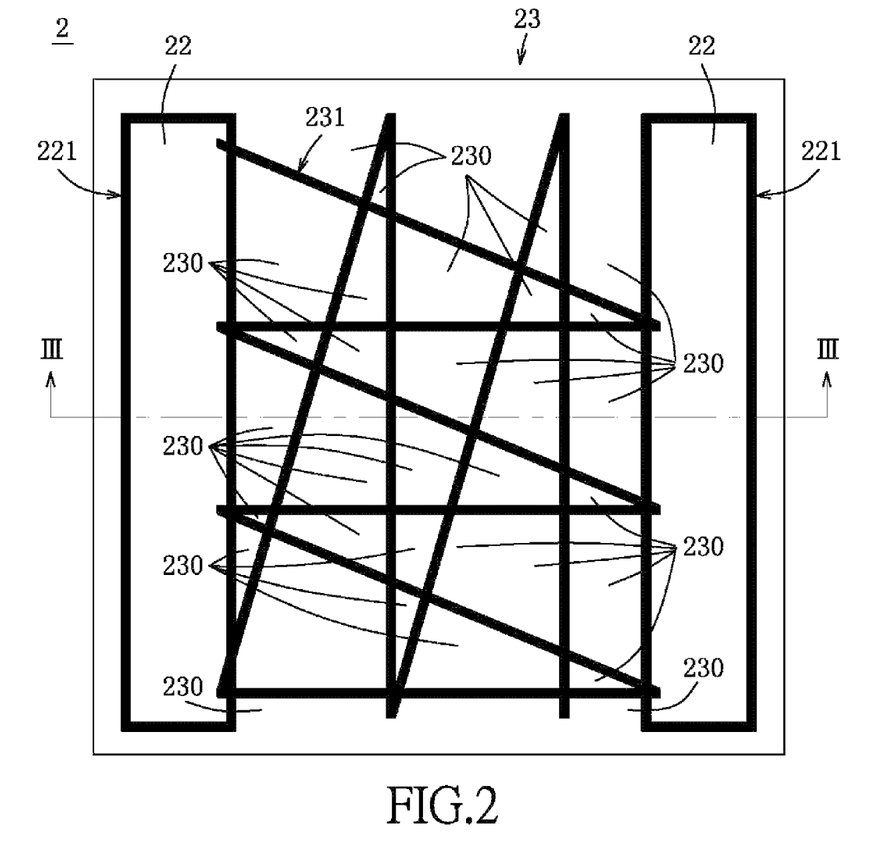
FIG. 2 is a top schematic diagram, illustrating a first embodiment of a touch control device of this disclosure.
Figure 3:
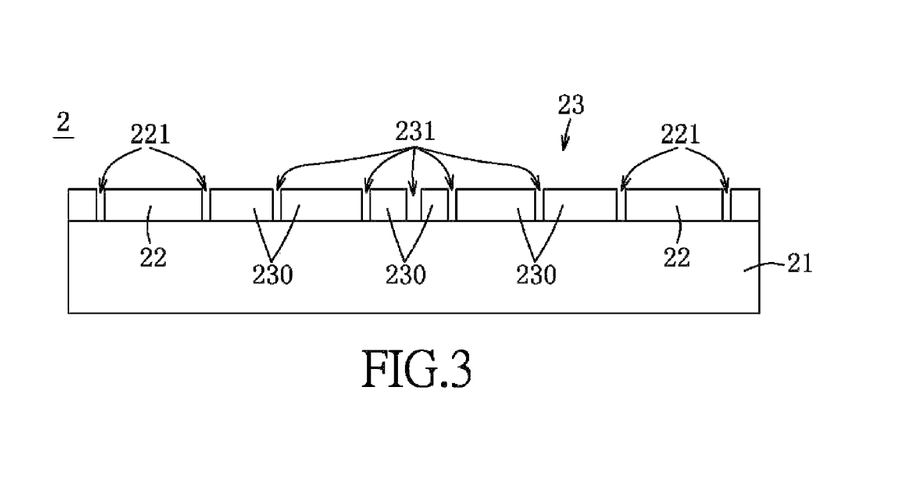
FIG. 3 is a side schematic view taken along line of FIG. 2.

Referring to FIGS. 1 to 3, a first embodiment of a touch control device 1 according to this disclosure is illustrated. The touch control device 1 is exemplified as a dual layer touch control electrode structure. Therefore, the touch control device 1 includes two sensing units 2 that are mutually spaced apart, and an adhesive layer 3 that is sandwiched between the two sensing units 2. The sensing units 2 are for providing touch sensing signals in respective different directions (e.g., X and Y directions). However, in other embodiments, the touch control device may adopt a single layer touch control electrode structure, in which case the touch control device 1 only needs to have one sensing unit 2.

Each sensing unit 2 includes a substrate 21, a plurality of (e.g., two in this embodiment) touch control electrode structures 22, and at least one (e.g., one in this embodiment, but may also become multiple to cooperate with the touch control electrode structures 22) dummy electrode set 23. The substrate 21 is electrically insulating and light transmissive, may be made from materials such as ethylene terephthalate, poly(ether sulfone), polyacrylate, poly(ethylene naphthalate), polyphenylene sulfide, polypropylene, polycarbonate, polyethylene terephthalate, glass, etc., and may be made of/from hard materials or flexible materials.

The touch control electrode structures 22 are mutually spacedly disposed on the same side of the substrate 21, are mutually electrically insulating, are for generating touch sensing signals, and can be made from transparent, electrically conducting materials such as indium tin oxide (ITO), indium zinc oxide (IZO), cadmium tin oxide (CTO), aluminum zinc oxide (AZO), indium tin zinc oxide (ITZO), zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO), nano-silver wires, carbon nanotubes, Graphene, etc. The structural shapes of these touch control electrode structures 22 are defined by trenches 221 that are mutually spaced apart and that are each formed into a closed shape (rectangular herein). It should be noted herein that in other embodiments, the shapes of the trenches 221 may be altered depending upon the structural shapes of the touch control electrode structures 22. In addition, the trenches 221 may be made through chemical etching, laser etching, mechanical etching, etc., but not limited to any particular processing technique.

The dummy electrode set 23 is disposed on the substrate 21 and located between the touch control electrode structures 22, may be made of the same or different fabrication materials with/from the touch control electrode structures 22, and includes a plurality of dummy electrode structures 230 that are different in shapes and sizes. The function of the dummy electrode structures 230 mainly resides in electrical and optical aspects, as specifically set forth below.

1. Electrical Aspect

Through the provision of the dummy electrode structures 230, when touch sensing occurs, sensing capacitance generated by the touch control electrode structures 22 can be increased, to thereby increase the overall amount of variation in the sensing capacitance so as to enhance the accuracy in touch detection. Therefore, the dummy electrode structures 230 need to be fabricated to conform a certain size specification in actual production so as to achieve the corresponding function of increasing the amount of variation in touch sensing capacitance.

If the sizes of the dummy electrode structures 230 are too big, signal interference may occur, resulting in miss-operation during touch control. Therefore, in practice, a suitable specification needs to be set for particular sizes.

2. Optical Aspect

Through the provision of the dummy electrode structures 230, a difference between the adjacent touch control electrode structures 22 in association with refraction of external lights resulting from the non-existence of corresponding materials in a gap between the two is eliminated. Therefore, the dummy electrode structures 230 need to be fabricated to conform a certain size specification in actual production so as to minimize the extent that the touch control electrode structures 22 are visually apparent to users.

However, if the sizes of the dummy electrode structures 230 are too big, short circuit problems easily arise with adjacent touch control electrode structures 22.

In view of the above, in this embodiment, by dividing the dummy electrode set 23 into multiple dummy electrode structures 230 of different regions, the requirements in both electrical and optical aspects may be satisfied. Specifically, a groove 231 that extends from a top face thereof through to the substrate 21 is formed to correspond in location with the dummy electrode set 23 (i.e., the thicker black lines in FIGS. 2, 5, 7 and 9). The groove 231 mainly has at least one bend (multiple bends are illustrated herein) between the adjacent touch control electrode structures 22 so as to divide the dummy electrode set 23 into multiple different regions to separately define the dummy electrode structures 230 that are different in size and shape.

In this embodiment, based on the characteristic of the laser etching process during fabrication of the sensing units 2, the basic extension shape of the groove 231 for the dummy electrode set 23 is a piecewise straight line. That is to say, the groove 231 can be divided at bending points thereof into multiple straight line segments that extend in different directions, and these straight line segments may be mutually intersecting or non-intersecting so as to define various extension shapes. In this embodiment, in order to define suitably sized dummy electrode structures 230, the basic extension feature is that the piecewise straight line shaped groove 231 is composed of two zigzag groove portions that are overlapping and intersecting so as define its shape. Since the zigzag shape is also composed of multiple straight line segments, it falls within the scope of piecewise straight line shape.

Figure 7:
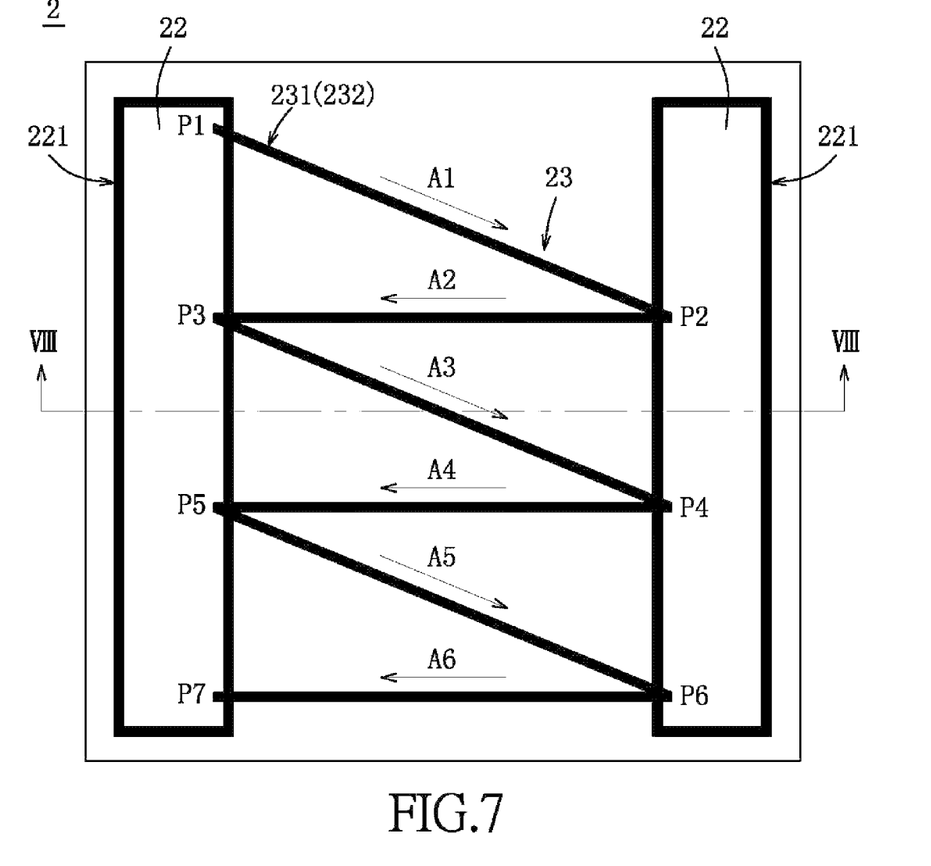
FIG. 7 is a top schematic diagram, illustrating the fabrication process following FIG. 5.
Figure 8:
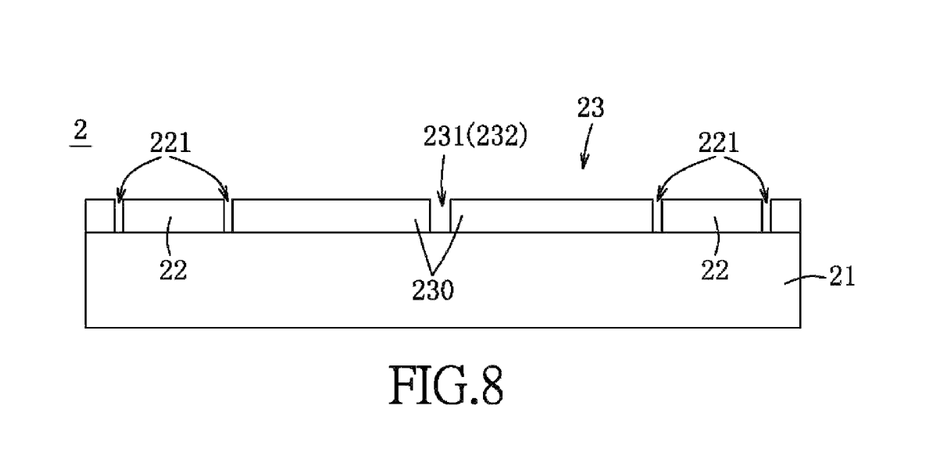
FIG. 8 is a side schematic view taken along line VIII-VIII of FIG. 7.
Figure 9:
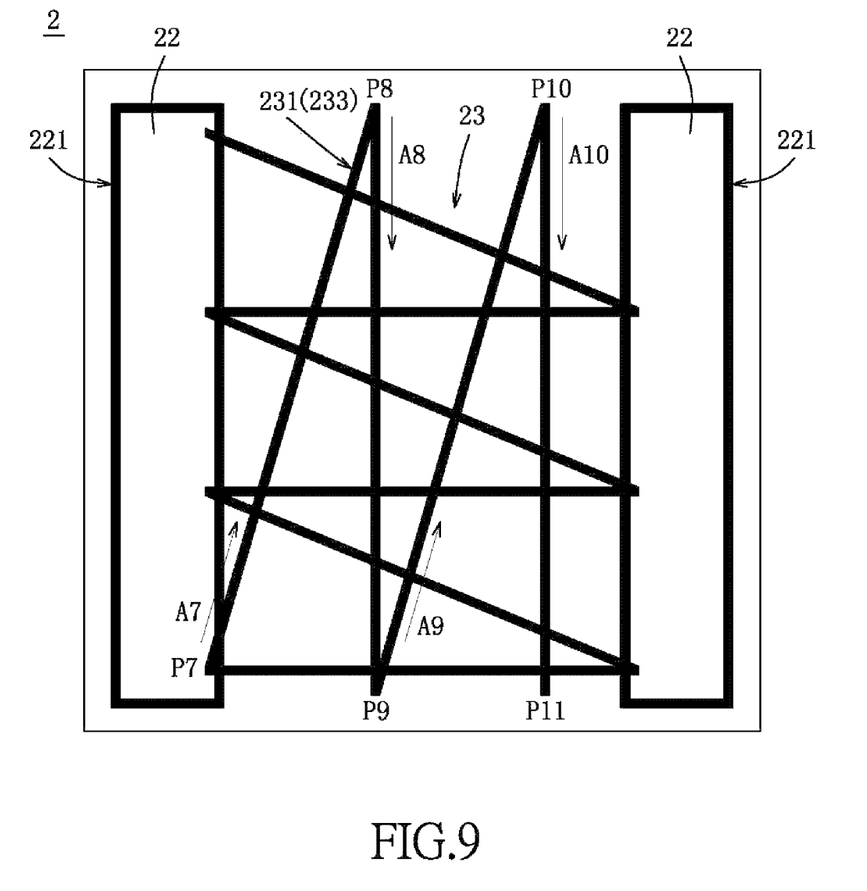
FIG. 9 is a top schematic diagram, illustrating the fabrication process following FIG. 7.
Figure 10:
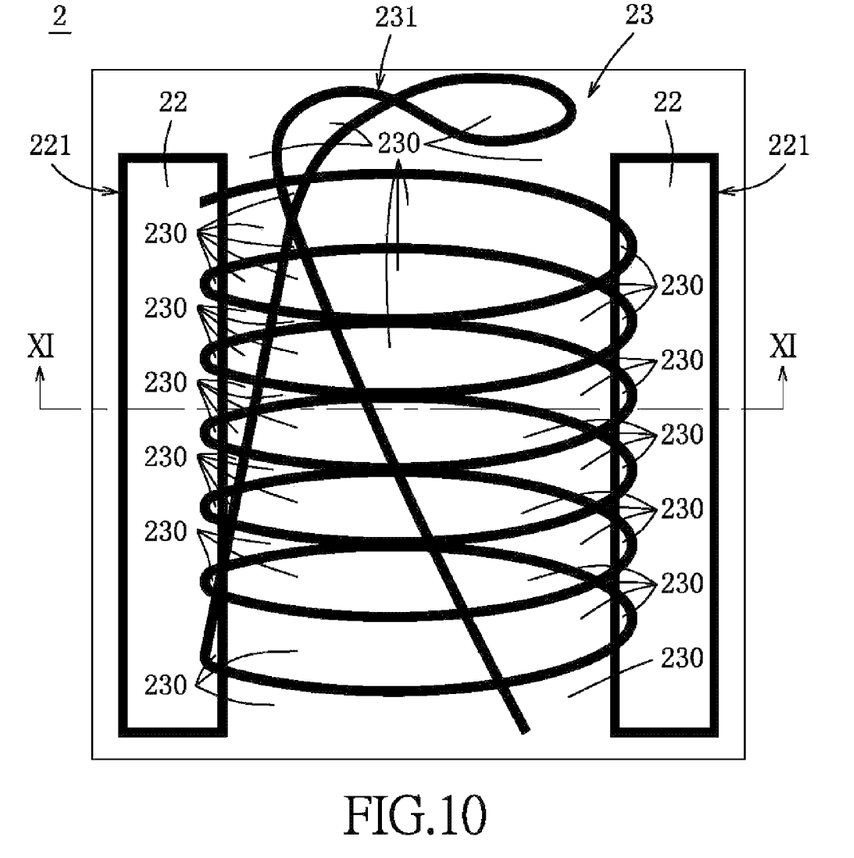
FIG. 10 is a top schematic diagram, illustrating a second embodiment of a touch control device of this disclosure.
Figure 11:
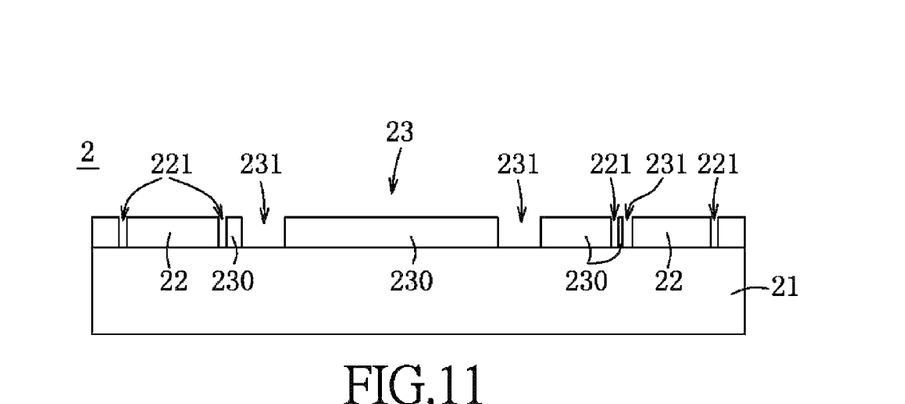
FIG. 11 is a side schematic view taken along line XI-XI of FIG. 10.

Referring to FIGS. 2, 7 and 9, specifically, in this embodiment, the groove 231 of the dummy electrode set 23 is divided into a first groove portion 232 and a second groove portion 233 that are mutually connected. The first groove portion 232 and the second groove portion 233 each have a zigzag extension shape, and are each formed with multiple acute bends. Here, the acute bends of the first groove portion 232 are located near the adjacent touch control electrode structures 22, while the acute bends of the second groove portion 233 are located between the touch control electrode structures 22, wherein the first groove portion 232 and the second groove portion 233 form a crossing net shape. Accordingly, the dummy electrode set 23 is divided into multiple regions by the first groove portion 232 and the second groove portion 233 of the groove 231, and are defined into the dummy electrode structures 230 of suitable sizes, such that the dummy electrode structures 230 present good electrical features and optical features. In particular, when the first groove portion 232 and the second groove portion 233 form the crossing net shape, the dummy electrode set 23 is divided into multiple regions of varying sizes and shapes, thereby being able to destroy the uniformity in refracting or reflecting directions of external light rays, to in turn obtain a better visual effect for the touch control device 1. However, in different embodiments, the first groove portion 232 and the second groove portion 233 may be arranged to not cross each other, while also define the shapes and patterns of the dummy electrode structures 230. Furthermore, in this embodiment, the bending locations of the first groove portion 232 partially extend to be within the touch control electrode structures 22. This embodying method can destroy the uniformity of the edge of the touch control electrode structures 22, and enhance the optical effect provided by the dummy electrode structures 230. However, in other embodiments, the groove 231 can also not extend to be within the touch control electrode structures 22, and is not limited to the disclosure above.

The following description refers to FIGS. 4 to 9 in relation with the fabrication method for the touch control device 1 of this embodiment.

Step S01: In this step, a structure body 4 is first formed on the substrate 21. In this embodiment, the structure body 4 is single layered, and is made from the aforesaid transparent, electrically-conductive materials, and can be processed by various coating technologies. However, in other different embodiments, the structure body 4 may be multi-layered, and can be etched in one go with laser.

Figure 4:
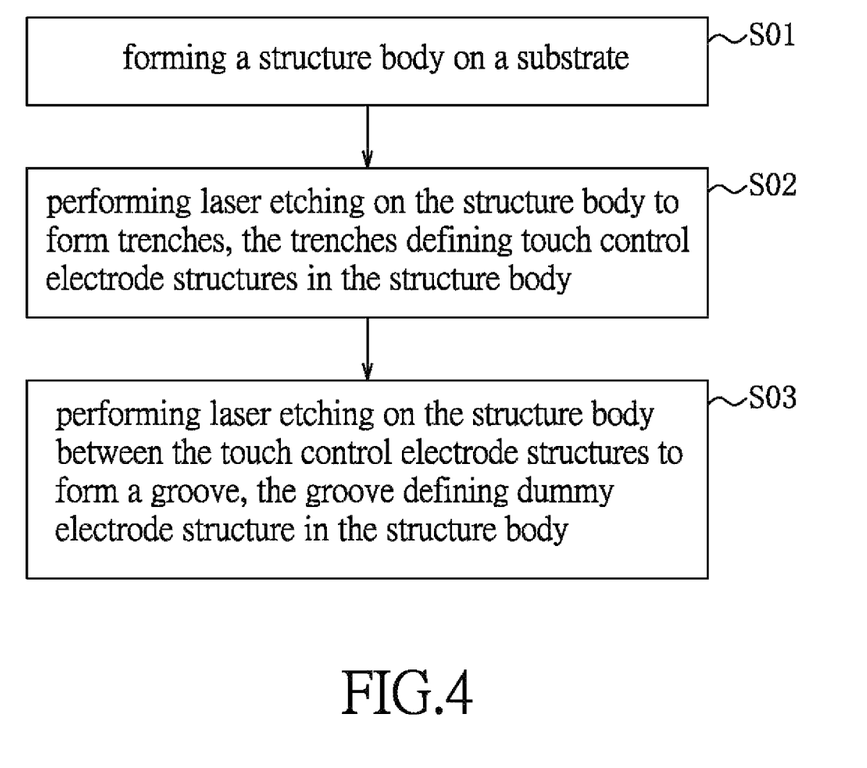
FIG. 4 is a flow chart, illustrating a fabrication method for a touch control device of this disclosure.
Figure 5:
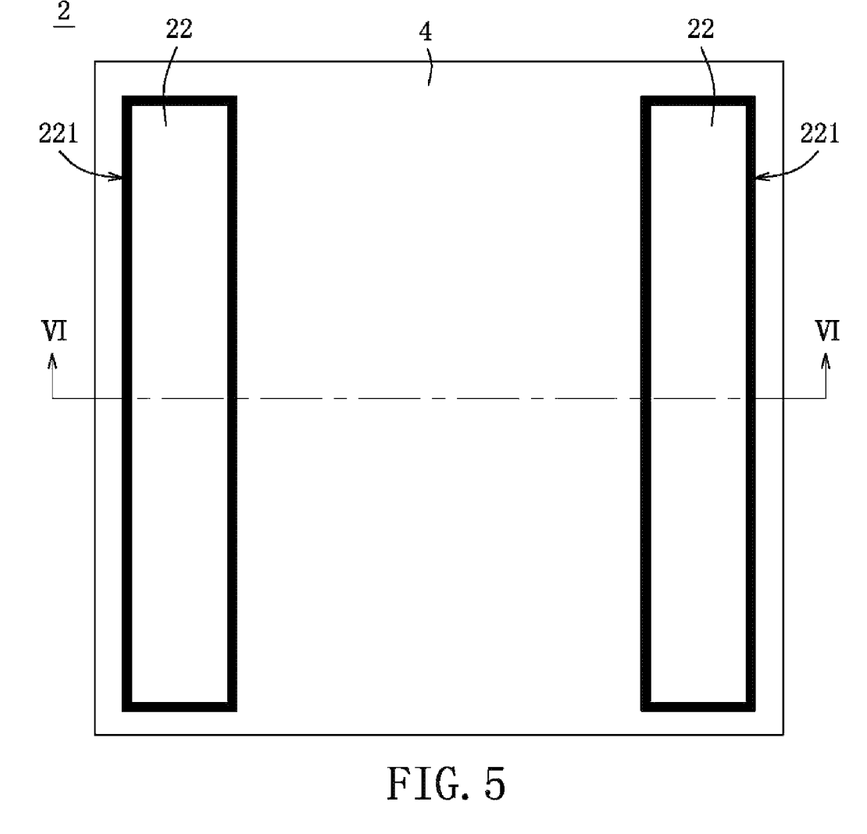
FIG. 5 is a top schematic diagram, illustrating the fabrication process of the first embodiment of the touch control device.
Figure 6:
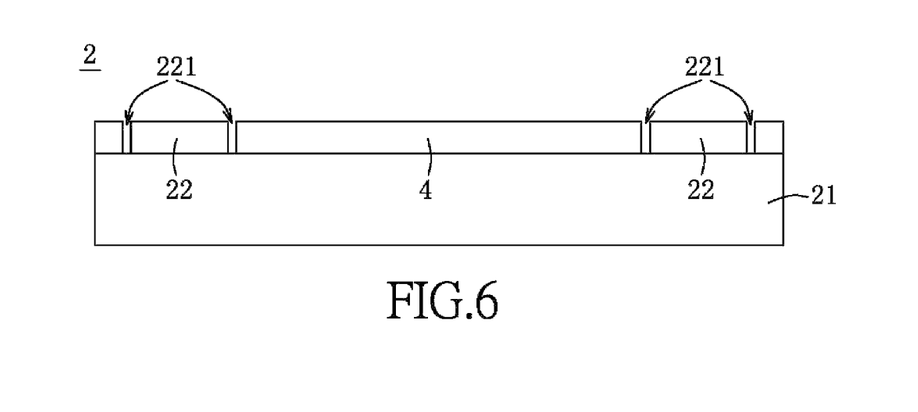
FIG. 6 is a side schematic view taken along line VI-VI of FIG. 5.

Step S02: Referring to FIGS. 4, 5 and 6, this step is to perform laser etching on the structure body 4 through laser etching technique, such that the structure body 4 is indentedly formed with multiple (e.g., two herein) mutually spaced apart trenches 221. The trenches 221 extend from the top face of the structure body 4 through to the substrate 21, and are each formed as a closed shape (rectangular herein) to define two touch control electrode structures 22 in the structure body 4 for generating touch sensing signals.

Step S03: With reference to FIGS. 4, 7, 8 and 9, this step is to perform laser etching on the structure body 4 mainly between the touch control electrode structures 22 such that the dummy electrode set 23 is formed into a plurality of dummy electrode structures 230 after being divided into multiple regions by the groove 231. In fabricating the groove 231 in this step, etching is continuously performed by laser in accordance with a predefined route.

As shown in FIG. 7, the fabrication process for the first groove portion 232 of the groove 231 is illustrated. In this embodiment, the first groove portion 232 of the groove 231 begins from point P1 that corresponds to a top side of the left touch control electrode structure 22, and is etched with laser along direction A1 towards the lower right direction, and turns to be etched along direction A2 at bending point P2 towards the left until reaching bending point P3, followed by being etched along direction A3, direction A4, direction A5 and direction A6 in sequence with the changing in direction happening at bending points P4, P5, P6 and P7 in sequence, such that the first groove portion 232 extends in a zigzag shape. It should be noted herein that the references to top, down, left, right orientations as used herein are merely for description with reference to the accompanying drawings, and do not represent the actual directions during the fabrication process. Moreover, depending upon different requirements, the route, advancing directions, starting point and bending points for the laser etching can all be adjusted accordingly, and are not to be limited to this disclosure.

With the route defined according to the above, the laser etching route can be continuous and uninterrupted, thereby saving time of fabrication. Furthermore, to achieve better fabrication effects, laser having a wavelength of 1064 nm with a pulse time falling between 200 us and 1000 us is used for performing the etching, and the width of the groove 231 after etching is controlled to be between 15 μm and 40 μm, and the depth of the groove 231 and the trenches 221 formed by laser etching the structure body 4 is controlled to be between 200 μm and 1000 μm.

In addition, based on differences in material and thickness of the structure body 4, the energy of the laser may be adjusted accordingly. For example, if the material of the structure body 4 is nano-silver, then the etching energy of the laser is preferably between 5 W to 20 W; when the material of the structure body 4 is silver paste, then the etching energy of the laser is preferably between 8 W to 13 W. The setting of the above fabrication parameters mainly takes into consideration the overall fabrication speed and the performance and yield rate of the final product. For example, if the width of the groove 231 is smaller than 15 μm, then the structure body 4 at two sides of the groove 231 may easily form short circuits, affecting the performance of the touch control device 1. The control of the etching depth is reflected in the fabrication time and the completeness of the final product. If the depth for each laser etching is smaller than 200 μm, then multiple etchings might be needed at the same location to complete the formation of the groove 231, resulting in increase in the fabrication time; however, if the depth for each laser etching is greater than 1000 μm, then the control of the etching depth may not be easy, and there may be a risk of damaging the substrate 21 when performing etching on the structure body 4 with the laser.

Moreover, according to the characteristic of laser processing technology, as the laser beam advances to each bending location, the advancing speed thereof needs to slow down, resulting in longer etching time period at the bending locations. Therefore, by suitably controlling the etching energy of the laser and the pulse time of each laser pulse in this embodiment, damage to the substrate 21 below the structure body 4 due to extensive etching period or excessive energy of the laser at the bending locations can be prevented. Regarding the damage ascertaining standard of the substrate 21, since tiny bubbles may be generated on the surface of the substrate 21 when the laser etches to the substrate 21, in this embodiment, the presence/absence of bubbles generated in the substrate 21 or the size of the bubbles is used as the basis for assessing whether the substrate 21 is damaged. For example, if the sizes of the bubbles are smaller than 30 μm, since bubbles of these sizes are not easily noticeable with the naked eye, it can be determined that the processing standard is satisfied. However, the determination standard as defined herein is for illustration purposes in this embodiment, and should not be taken as limitations.

On the other hand, as shown in FIG. 9, after completing the formation of the first groove portion 232, the aforementioned laser etching procedure can continue to carry on, executing the formation of the second groove portion 233. Here, the second groove portion 233 begins at the termination point P7 of the first groove portion 232, and the laser continues to turn to move along direction A7 towards the upper right direction to move to bending point P8, followed by moving along directions A8, A9 and A10 in sequence with the changing of directions occurring at bending points P9 and P10 in sequence, and then terminating at terminating point P11, thereby completing the formation of the second groove portion 233, and dividing the dummy electrode set 23 into multiple smaller regions. Herein, the fabrication parameters of the laser etching of the second groove portion 233 are identical to the first groove portion 232, and thus the optimal fabrication quality is achievable.

It should be noted that in this embodiment, since the first groove portion 232 and the second groove portion 233 are partly crossing in location, in step S03, the structure body 4 at the crossing locations will undergo two laser etching treatments. In order to prevent damage of the substrate 21 at the locations of crossing of the first groove portion 232 and the second groove portion 233, this embodiment utilizes control of suitable amounts of laser energy, laser pulse time, and laser advancing speed to ensure that the structure body 4 is completely removed after two laser etching treatments, while the substrate 21 below satisfies the aforesaid standard for determining damages.

Therefore, by combining the fabrication steps S01, S02 and S03 described above, this disclosure performs etching on the structure body 4 with laser to easily complete the shape definition of the touch control electrode structures 22 and the dummy electrode set 23. As compared with the lithography and etching processes conventionally used, the number of fabrication steps can be reduced, to thereby save fabrication time and cost. In addition, this embodiment further prevents unnecessary damages to the substrate 21 by setting the route and fabrication parameters of the laser etching to facilitate continuous advancing of the laser etching. Therefore, the effect of fine fabrication is achieved.

It should be specifically noted herein that while the fabrication method of this invention is performed in the order of laser etching procedure for the touch control electrode structures 22 (step S02) and laser etching procedure for the dummy electrode set 23 (step S03), since the route of laser etching in the above procedures are executed according to predefined paths, it is not necessary to have a specific order of execution. Therefore, after step S01 is performed, step S03 may be first performed to define the dummy electrode structures 230 of the dummy electrode set 23, followed by executing step S02 to define the touch control electrode structures 22. On the other hand, while specific details of the laser etching procedures and the shape of the groove 231 are mentioned in the above description of this embodiment, these implementing techniques can be suitably adjusted based on practical needs, and are not limited to the content of this embodiment.

With reference to FIGS. 10, 11, 14 and 16, the second embodiment of a touch control device 1 of this disclosure is illustrated. Herein, while the groove 231 for the dummy electrode set 23 also mainly extends and bends between the touch control electrode structures 22, the shapes of bending thereof differs from that of the first embodiment.

Figure 14:
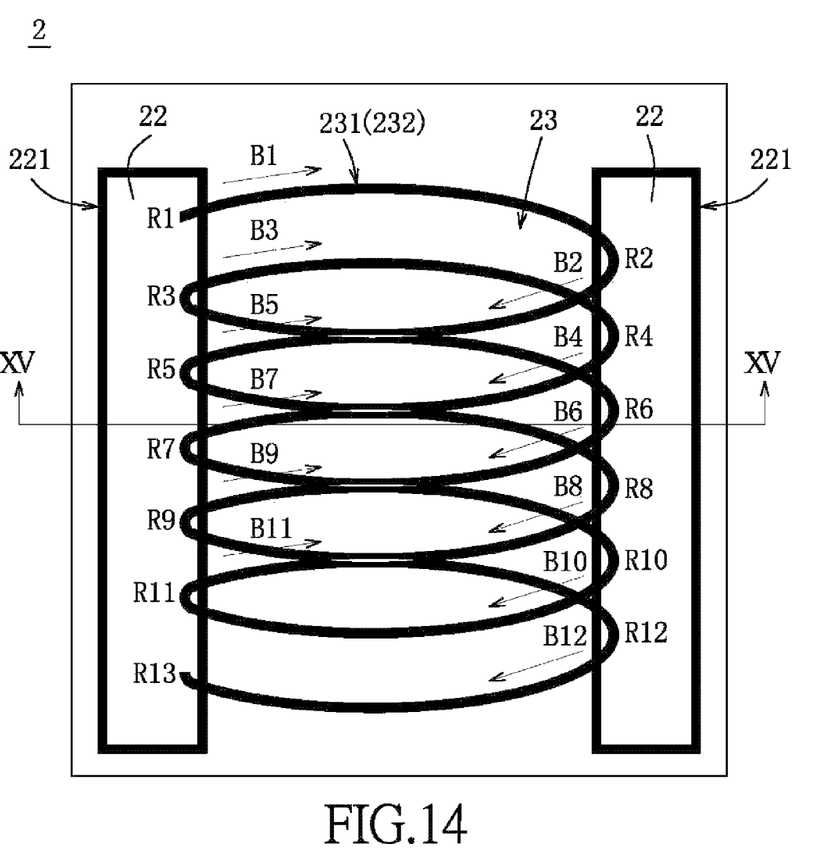
FIG. 14 is a top schematic diagram, illustrating the fabrication process following FIG. 12.
Figure 15:
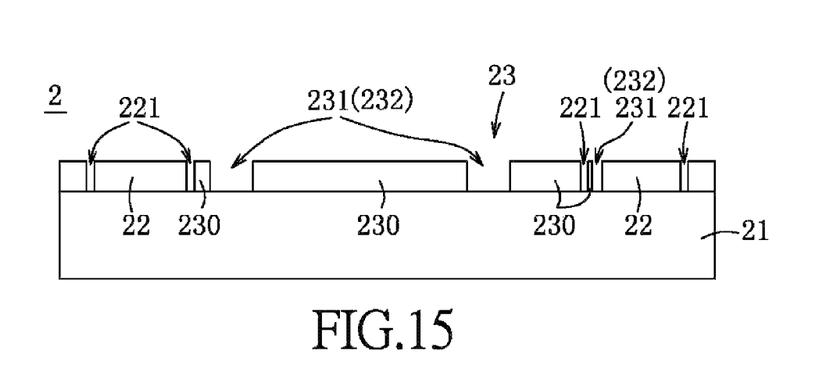
FIG. 15 is a side schematic view taken along line XV-XV of FIG. 14.
Figure 16:
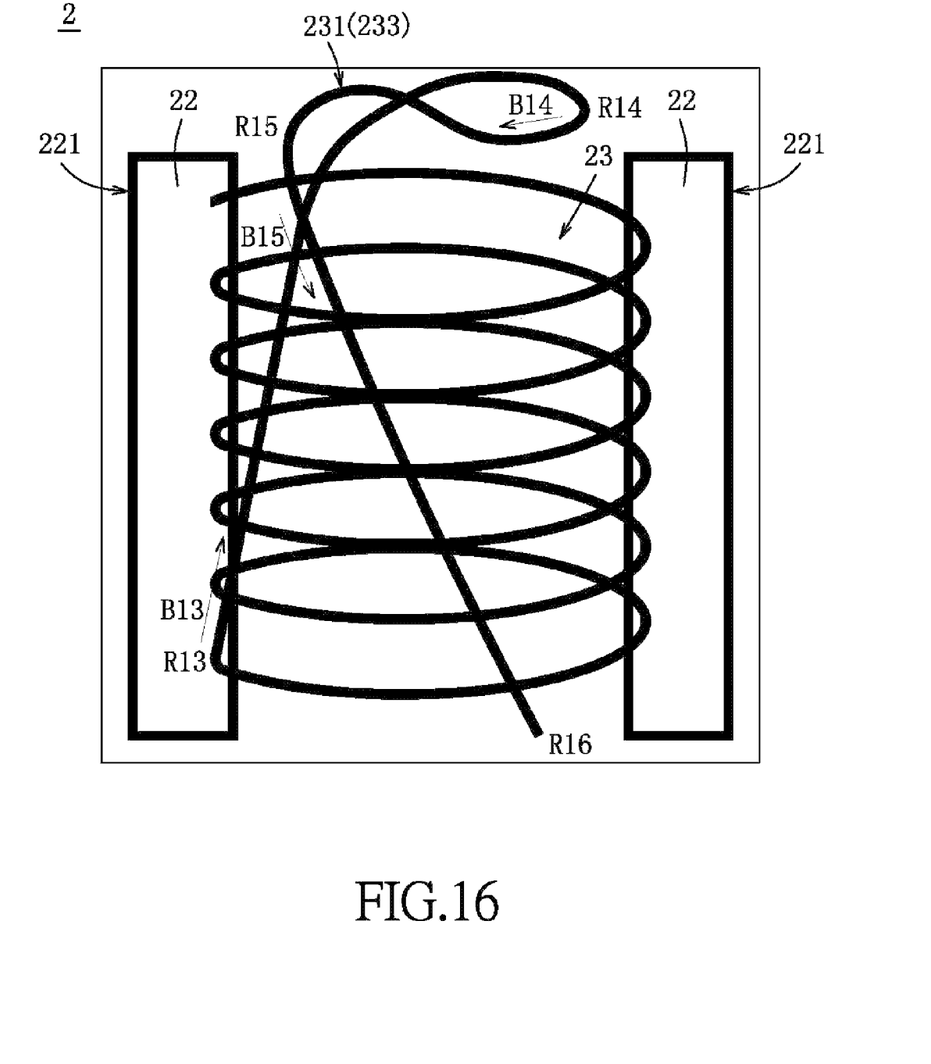
FIG. 16 is a top schematic diagram, illustrating the fabrication process following FIG. 14.

In brief, in this embodiment, the bending portions of the groove 231 for the dummy electrode set 23 appear curvy, and are different from the acute angles of the first embodiment. More specifically, the curvy bends of the groove 231 may be the regular spiral shape of the first groove portion 232 as depicted in FIG. 14, or the irregular curve of the second groove portion 233 as depicted in FIG. 16.

In the following, reference is made to FIG. 4 and the relevant drawings to illustrate the fabrication method of the touch control device of this embodiment.

Figure 12:
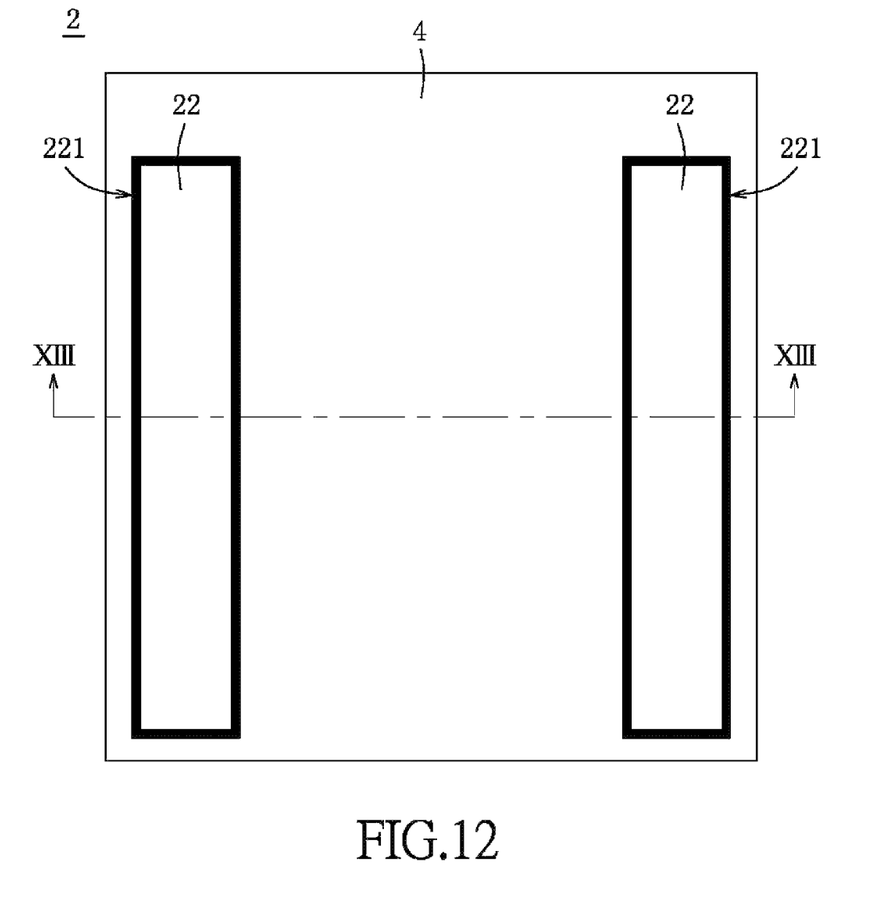
FIG. 12 is a top schematic view, illustrating the fabrication process of the second embodiment of the touch control device.
Figure 13:
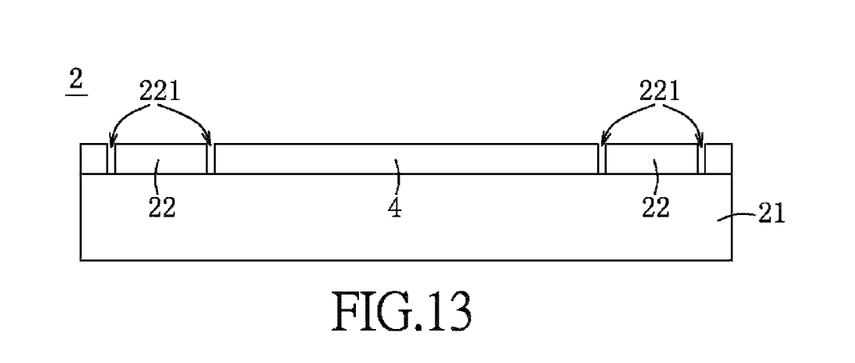
FIG. 13 is a side schematic view taken along line XIII-XIII of FIG. 12.

Steps S01, S02: With reference to FIGS. 4, 12 and 13, these steps are similar to the first embodiment, so further details are omitted.

Step S03: With reference to FIGS. 4, 14, 15 and 16, this step is to form the dummy electrode structures 230 that are divided into multiple regions by the groove 231.

Firstly, referring to FIG. 14, in making the first groove portion 232 of this embodiment, it begins from starting point R1 at the top side of the left touch control electrode structure 22 and moves towards the bending point R2 in direction B1 in a curved path, followed by sequentially advancing in directions B2-B12 through bending points R3-R12, and eventually reaching the terminating point R13, such that the first groove portion 232 extends in a predefined path to exhibit a spiral shape, and such that the bending locations are close to the trenches 221 which define the touch control electrode structures 22. During this process, since the laser advances in a curvy manner at the bending locations, a relatively faster laser advancing speed can be maintained as compared to the acute angle bending manner of the first embodiment, thereby reducing the fabrication time required. More preferably, a preferable radius of the bending locations fall between 50 μm and 250 μm. If the radius is smaller than 50 μm, the bending locations are similar to the acute angle bends in shape, making the laser having to reduce speed when advancing through these regions, and possibly resulting in excessive etching period due to the slowed-down advancing speed, and thus damaging the substrate 21 beneath.

Next, with reference to FIG. 16, after completing the fabrication of the first groove portion 232, this embodiment continues with the fabrication of the second groove portion 233 of the groove 231. Here, the second groove portion 232 starts from the starting point R13 at the bottom side of the left touch control electrode structure 22, and moves towards the bending point R14 along direction B13 towards the upper right side in a curved manner, followed by advancing along directions B14 and B15 from point R14 and terminating at terminating point R16 after passing through the bending point R15 to complete the fabrication of the irregularly shaped second groove portion 233. During the fabrication process of the second groove portion 233, when the laser advances to each bending point, the curved manner of advancement is maintained, thereby maintaining a certain advancing speed level, to effectively control the fabrication time and prevent damages from occurring in the substrate 21.

Similar to the previous first embodiment, the execution order of the steps S02 and S03 of this embodiment can be interchanged based upon actual needs, and the extension shape of the groove 231 may be adjusted to the spiral shape of the first groove portion 232 or the irregular curvy shape of the second groove portion 233 depending upon the requirements, as long as the bending parts are designed to advance in curvy ways.

In view of the aforesaid two embodiments, the touch control device 1 of this disclosure is fabricated using laser etching, and has good device performance due to the division of the groove 231 into multiple regions for the dummy electrode set 23. Moreover, the fabrication method of this disclosure adopts the laser etching technology, and in comparison with the conventional lithography and etching fabrication techniques, can effectively reduce the fabrication steps, as well as fabrication time and cost. Furthermore, the fabrication method of this disclosure can further enhance the performance of the touch control device 1 or various devices manufactured by laser etching through suitable setup of the laser etching route and fabrication parameters. Therefore, the touch control device 1 and the fabrication method thereof of this disclosure can indeed achieve the object of this disclosure.

While the present invention has been described in connection with what are considered the exemplary embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A touch control device comprising:
   at least one sensing unit, said sensing unit comprising:
      a substrate, wherein said substrate is electrically insulating and light transmissive;
      a plurality of touch control electrode structures spaced apart from one another and disposed on a same side of said substrate, wherein said touch control electrode structures are electrically insulated from one another; and at least one dummy electrode set disposed on said substrate and located between two adjacent touch control electrode structures of said touch control electrode structures, wherein:
  said dummy electrode set forms a groove that extends from a top side of said dummy electrode set to said substrate,
  said dummy electrode set comprises a plurality of dummy electrode structures that are dividedly defined by said groove,
  said groove extends between said adjacent touch control electrode structures and forms at least two adjoining bends,
  a first bend of said two adjoining bends is located at a first location that corresponds to and is on a first touch control electrode structure of said adjacent touch control electrode structures,
  a second bend of said two adjoining bends is located at a second location that corresponds to and is on a second touch control electrode structure of said adjacent touch control electrode structures,
  said groove comprises:
    a first continuous straight line that extends from a point that corresponds to said first touch control electrode structure to said second location that corresponds to said second touch control electrode structure of said adjacent touch control electrode structures:
    a second continuous straight line that extends from said second location that corresponds to said second touch control electrode structure to said first location that corresponds to said first touch control electrode structure of said adjacent touch control electrode structures; and
    a third continuous straight line that extends from said first location that corresponds to said first touch control electrode structure of said adjacent touch control electrode structures to a third location that corresponds and is on said second touch control electrode structure of said adjacent touch control electrode structures,
  said first bend is formed by said first continuous straight line and said second continuous straight line,
  said second bend is formed by said second continuous straight line and said third continuous straight line, and
  said groove is formed by a continuous and uninterrupted laser etching process.

2. The touch control device as claimed in claim 1, wherein said first bend of said groove forms an acute angle.

3. The touch control device as claimed in claim 1, wherein said groove extends and is distributed in a zigzag shape.

4. The touch control device as claimed in claim 3, wherein said groove is divided into a first groove portion and a second groove portion that intersect one another.

5. The touch control device as claimed in claim 4, wherein said first groove portion and said second groove portion of said groove cross each other to have a net shape appearance.

6. The touch control device as claimed in claim 1, wherein said first bend of said groove is curvy.

7. The touch control device as claimed in claim 6, wherein said groove extends and is distributed in a spiral shape.

8. The touch control device as claimed in claim 6, wherein said first bend has a radius that ranges between 50 μm and 250 μm.

9. The touch control device as claimed in claim 1, wherein said groove has a width that ranges between 15 μm and 40 μm.

10. The touch control device as claimed in claim 1, wherein said touch control electrode structures are each defined by a trench.

* * * * *